(12) United States Patent
Matsuno (10) Patent No.: US 10,230,225 B2
(45) Date of Patent: Mar. 12, 2019

(54) WIRING STRUCTURE AND IMAGE FORMING APPARATUS

(71) Applicant: KYOCERA Document Solutions Inc., Osaka (JP)

(72) Inventor: Akinori Matsuno, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 2 days.

(21) Appl. No.: 15/673,469

(22) Filed: Aug. 10, 2017

(65) Prior Publication Data

US 2018/0062363 A1    Mar. 1, 2018

(30) Foreign Application Priority Data

Aug. 29, 2016   (JP) ................ 2016-166903

(51) Int. Cl.
| | |
|---|---|
| *H02G 3/04* | (2006.01) |
| *H04N 1/00* | (2006.01) |
| *H05K 9/00* | (2006.01) |
| *G03G 15/00* | (2006.01) |
| *G03G 21/16* | (2006.01) |
| *H04N 1/031* | (2006.01) |

(52) U.S. Cl.
CPC ......... *H02G 3/0481* (2013.01); *G03G 15/80* (2013.01); *G03G 21/1652* (2013.01); *H04N 1/0083* (2013.01); *H05K 9/0064* (2013.01); *H04N 1/00588* (2013.01); *H04N 1/031* (2013.01); *H04N 2201/0094* (2013.01)

(58) Field of Classification Search
CPC . H01R 13/65802; H01R 9/034; H05K 9/0064
See application file for complete search history.

(56) References Cited

U.S. PATENT DOCUMENTS

| | | | | |
|---|---|---|---|---|
| 6,107,572 | A * | 8/2000 | Miyazaki | ............ H01R 9/0518 |
| | | | | 174/75 C |
| 8,693,908 | B2 * | 4/2014 | Nishiyama | ........... G03G 15/104 |
| | | | | 399/237 |
| 2014/0284100 | A1 * | 9/2014 | Ichikawa | ............ B60R 16/0215 |
| | | | | 174/70 R |

FOREIGN PATENT DOCUMENTS

JP     2007-317776 A    12/2007

* cited by examiner

*Primary Examiner* — William H. Mayo, III
*Assistant Examiner* — Hiram E Gonzalez
(74) *Attorney, Agent, or Firm* — Studebaker & Brackett PC (57) ABSTRACT

A wiring structure according to the present disclosure includes a shield tube, a metal wire, and a plate-like member. The shield tube covers a wiring. The metal wire fixes the shield tube. The metal wire fixes the shield tube to the plate-like member by pressing the shield tube against the plate-like member. The plate-like member is connected to a grounding path in a manner that enables electric conduction. The shield tube is connected to the grounding path via the plate-like member in a manner that enables electric conduction.

12 Claims, 8 Drawing Sheets

WIRING STRUCTURE AND IMAGE FORMING APPARATUS

INCORPORATION BY REFERENCE

The present application claims priority under 35 U.S.C. § 119 to Japanese Patent Application No. 2016-166903, filed on Aug. 29, 2016. The contents of this application are incorporated herein by reference in their entirety.

BACKGROUND

The present disclosure relates to a wiring structure and an image forming apparatus.

A ferrite core case accommodates a flat cable. Further, the ferrite core case includes a core case portion and a cable case portion. The core case portion accommodates a ferrite core. The cable case portion has a shape conforming to a wiring path of the flat cable. As a result of insertion of the flat cable through the cable case portion, the ferrite core is positioned with respect to the flat cable and fixed to the flat cable.

SUMMARY

A wiring structure according to a first aspect of the present disclosure includes a shield tube configured to cover a wiring and a metal wire fixing the shield tube. The shield tube is connected to a grounding path in a manner that enables electric conduction.

An image forming apparatus according to a second aspect of the present disclosure includes the wiring structure according to the first aspect and an image forming device that forms an image on a recording medium.

DETAILED DESCRIPTION

The following describes embodiments of present disclosure with reference to the drawings (FIGS. 1 to 8). Note that in the drawings, elements that are the same or substantially equivalent are labelled using the same reference signs and explanation thereof will not be repeated.

Figure 1:
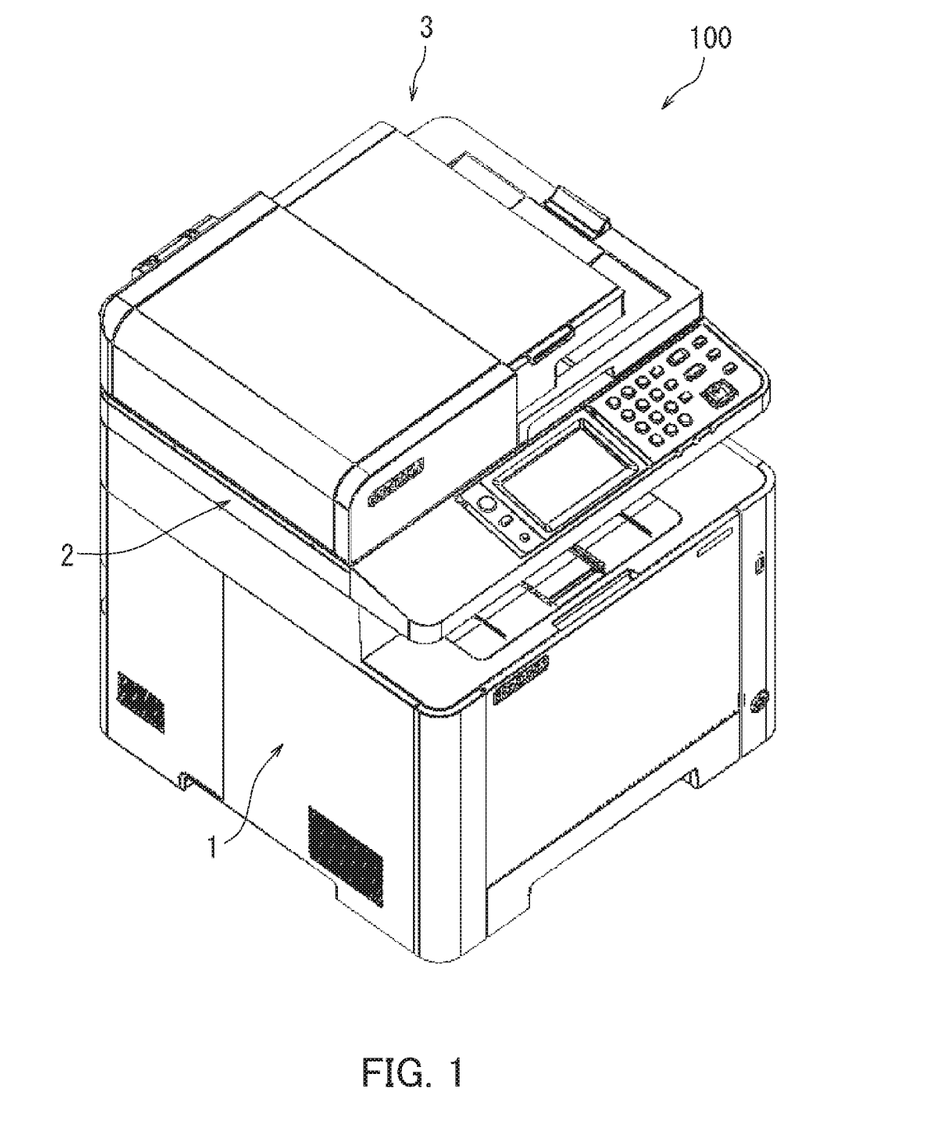
FIG. 1 is a perspective view illustrating an image forming apparatus according to an embodiment of the present disclosure.
Figure 2:
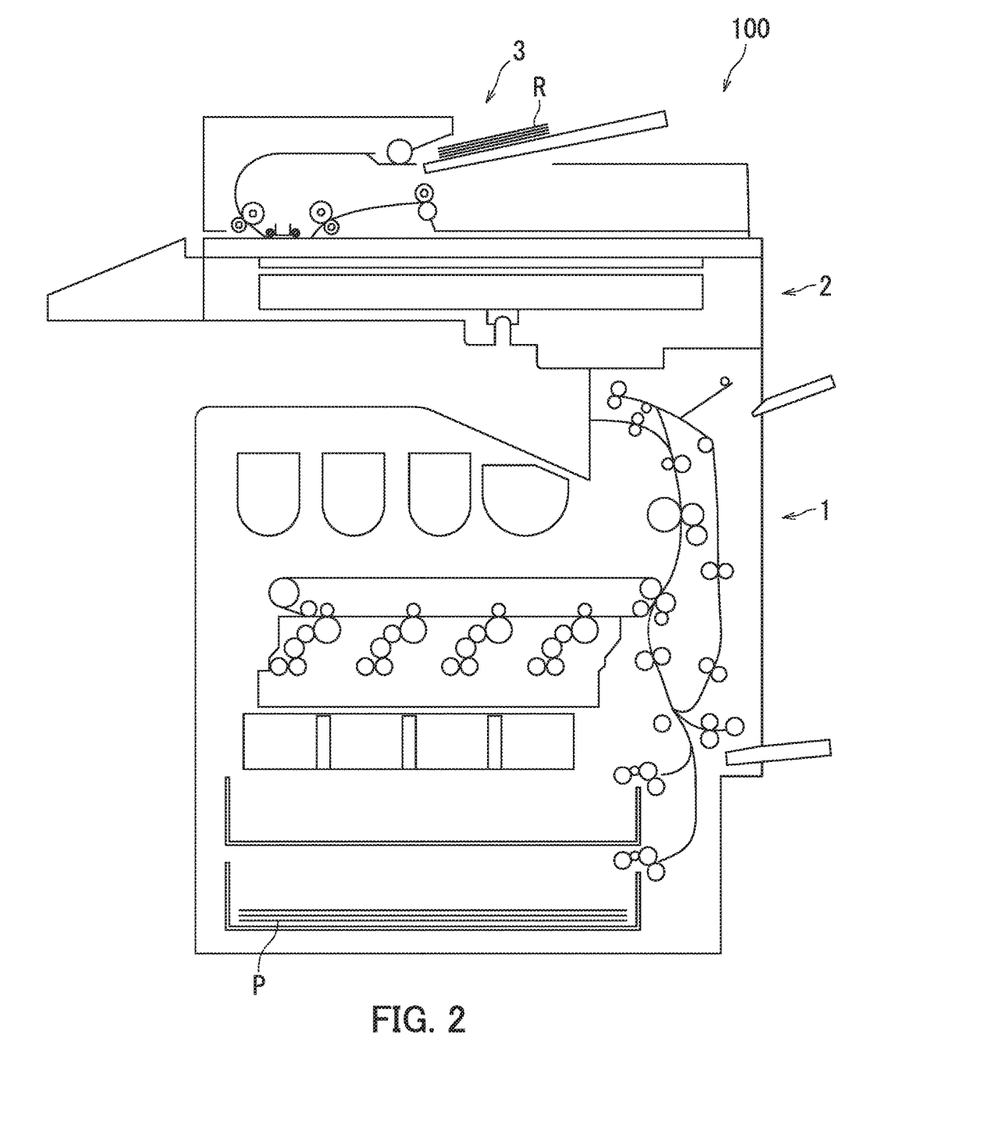
FIG. 2 is a diagram illustrating a configuration of the image forming apparatus according to the embodiment of the present disclosure.

First, an image forming apparatus 100 according to an embodiment of the present disclosure will be described with reference to FIGS. 1 and 2. FIG. 1 is a perspective view illustrating the image forming apparatus 100. FIG. 2 is a diagram illustrating a configuration of the image forming apparatus 100. As illustrated in FIGS. 1 and 2, the image forming apparatus 100 is a multifunction peripheral.

The image forming apparatus 100 includes an image forming unit 1, an image reading unit 2, and a document conveyance unit 3.

The image forming unit 1 forms an image on paper P. The image forming unit 1 forms the image on the paper P by a so-called "electrophotographic method". The paper P is an example of a "recording medium". The image forming unit 1 corresponds to an "image forming device".

The image reading unit 2 reads an image of a document R. The image reading unit 2 includes for example a contact image sensor (CIS) unit, and the CIS unit reads the image of the document R.

The document conveyance unit 3 conveys the document R to the image reading unit 2. The document conveyance unit 3 constitutes a so-called auto document feeder (ADF).

Figure 3:
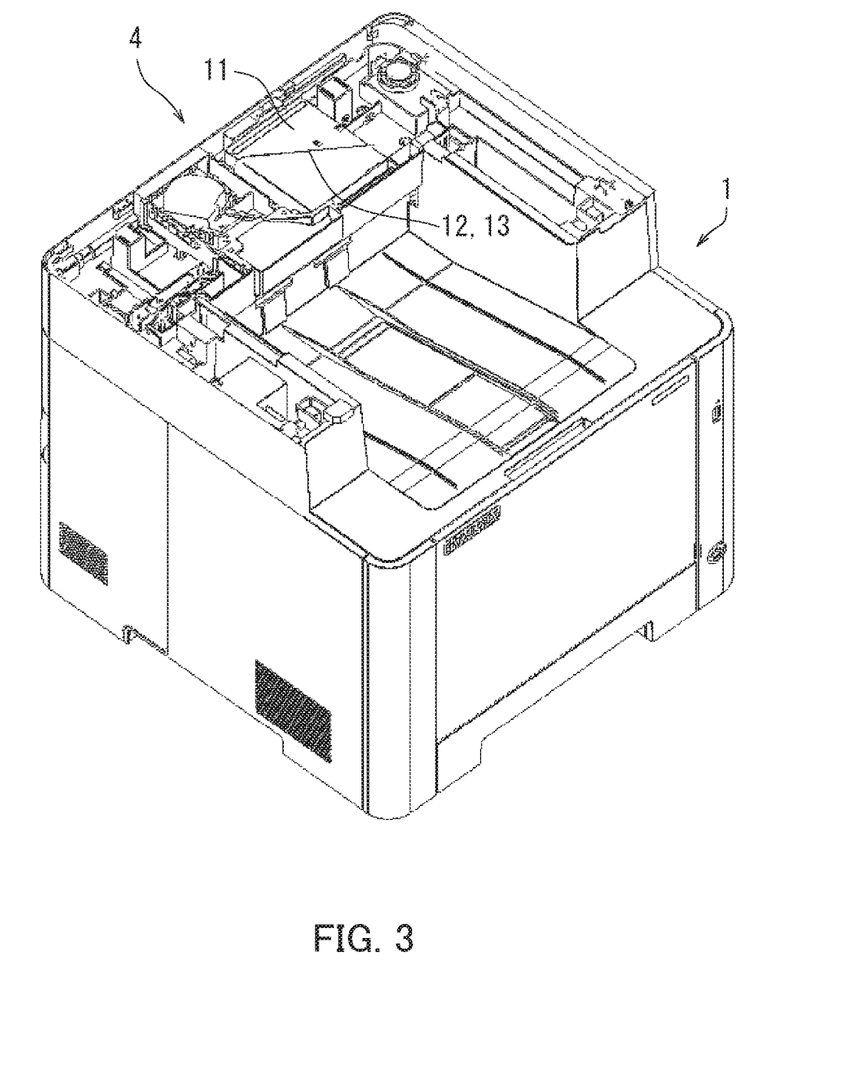
FIG. 3 is a perspective view illustrating an example of a wiring structure according to an embodiment of the present disclosure.

Next, an example of a wiring structure according to an embodiment of the present disclosure will be described with reference to FIGS. 3 to 6. FIG. 3 is a perspective view illustrating a wiring structure 4 as the example of the wiring structure.

Figure 4:
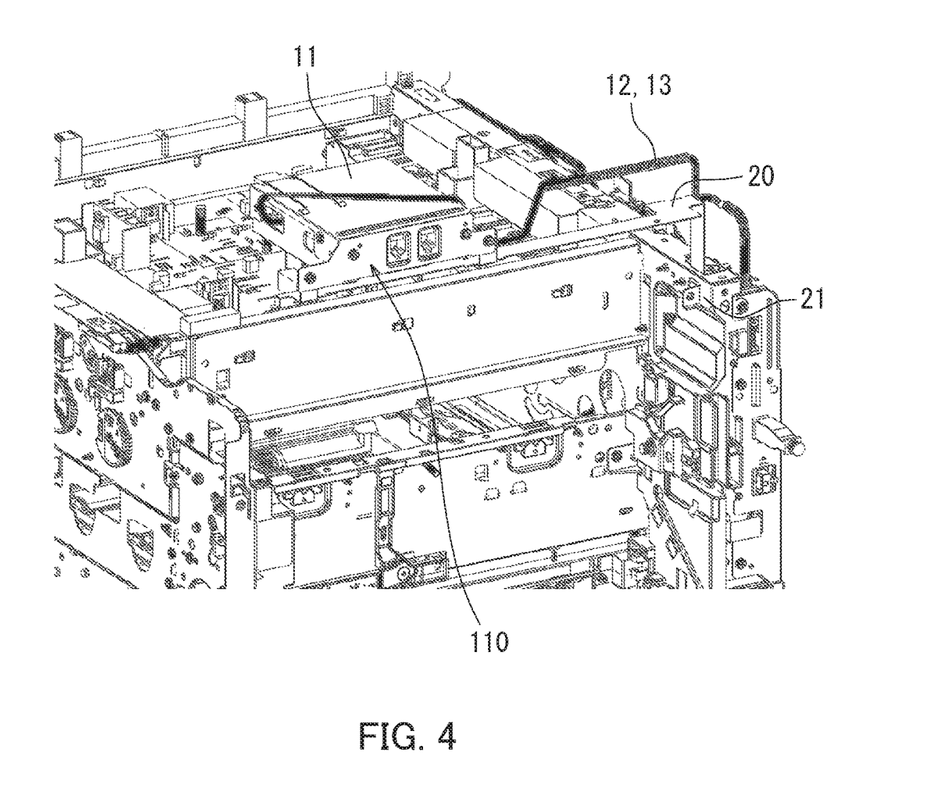
FIG. 4 is a diagram illustrating the wiring structure illustrated in FIG. 3 from a different direction.

FIG. 3 illustrates a state in which the image reading unit 2 and the document conveyance unit 3 are removed from the image forming apparatus 100 illustrated in FIG. 1. That is, various members located on an upper surface of the image forming unit 1 are exposed in FIG. 3. FIG. 4 is a diagram illustrating the wiring structure 4 from a different direction. Also, other components and a resin frame and the like for holding the other components are omitted in FIG. 4 in order to facilitate understanding of the wiring structure 4.

As illustrated in FIGS. 3 and 4, the wiring structure 4 is located on the upper surface of the image forming unit 1. The wiring structure 4 includes a plate-like member 11, a wiring 12, and a shield tube 13. Also, the image forming unit 1 includes a frame 21.

The plate-like member 11 is formed from an electrically conductive material and has the shape of a rectangular flat plate in a plan view. The plate-like member 11 is for example formed from a metal such as stainless steel or aluminum. Further, the plate-like member 11 is connected to a grounding path 20 to be grounded. The plate-like member 11 corresponds to an example of an "electrically conductive member".

The grounding path 20 is an electrically conductive metal plate. One end of the grounding path 20 is connected to the plate-like member 11 and another end of the grounding path 20 is connected to the frame 21. Also, the frame 21 is grounded via a power cord not illustrated.

The wiring 12 transmits various signals or electric power. The wiring 12 in the present embodiment is constituted by electric wires that transmit electric power.

The shield tube 13 has the shape of a hollow cylinder and covers an outer circumference of the wiring 12. That is, the wiring 12 extends through the shield tube 13. Also, the shield tube 13 is formed to be stretchable by weaving electrically conductive threads. The "threads" each include for example a core formed from an aramid resin, and a surface of the core is covered by tinned copper foil. Specifically, ZSK-HF series (product name) produced by Zippertubing (Japan), Ltd. can be suitably used as the shield tube 13. Since the shield tube 13 is stretchable, the outer circumference of the wiring 12 can be covered by the shield tube 13 even in a configuration in which the wiring 12 is arranged in a curved manner.

Figure 5:
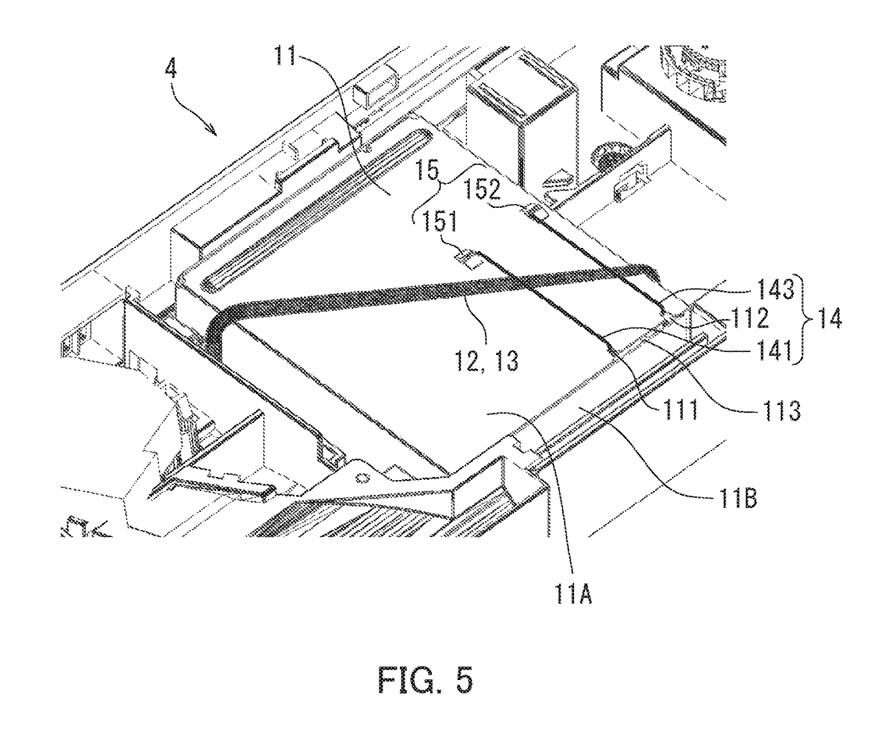
FIG. 5 is an enlarged view of the ng structure illustrated in FIG. 3.
Figure 6:
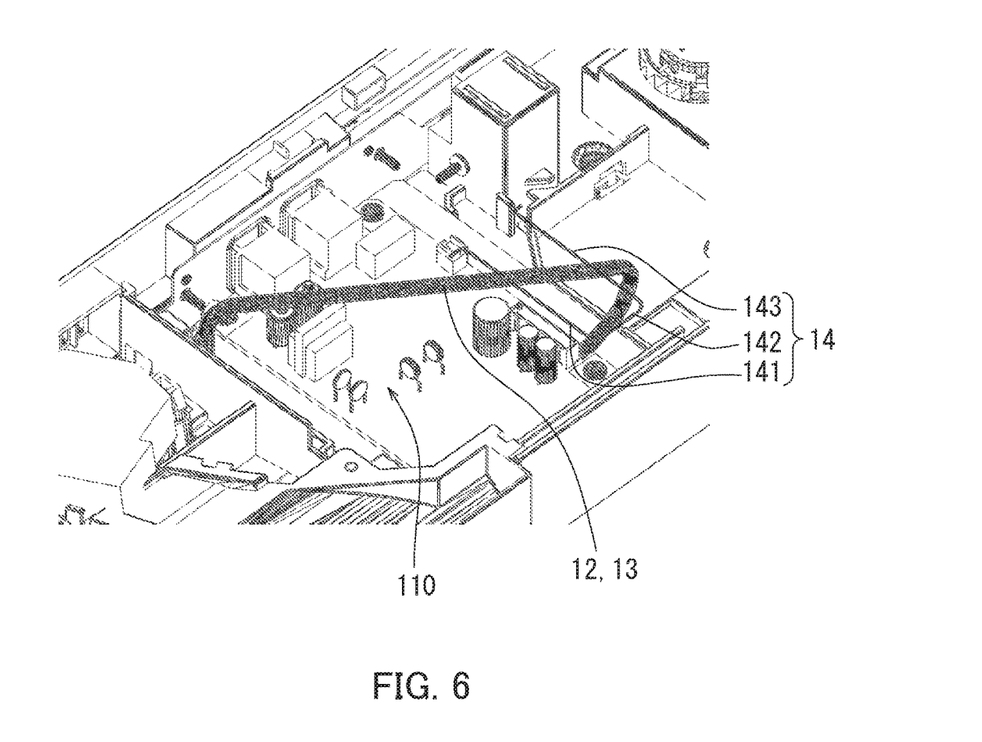
FIG. 6 is a diagram illustrating a state in which a plate-like member illustrated in FIG. 5 is removed.

Next, the wiring structure 4 will be described in more detail with reference to FIGS. 5 and 6. FIG. 5 is an enlarged view of the wiring structure 4. FIG. 6 is a diagram illustrating a state in which the plate-like member 11 illustrated in FIG. 5 is removed. As illustrated in FIG. 5, the wiring structure 4 further includes a metal wire 14 and a fixing member 15. Also, the plate-like member 11 is in the shape of a box and has a top plate 11A, a side plate 11B, a notch 111, and a notch 112. The side plate 11B has an opening 113.

The notches 111 and 112 are formed along a side of the top plate 11A of the plate-like member 11 to be spaced apart from each other. The notches 111 and 112 communicate with each other via the opening 113. The metal wire 14 passes through the notches 111 and 112.

The fixing member 15 fixes the metal wire 14 to the plate-like member 11. The fixing member 15 includes a first fixing member 151 and a second fixing member 152. The first fixing member 151 and the second fixing member 152 are each formed by raising a slit part of the plate-like member 11.

The metal wire 14 fixes the shield tube 13 to the plate-like member 11 by pressing the shield tube 13 against the plate-like member 11. The metal wire 14 is a metallic wire having electrical conductivity and flexibility. The metal wire 14 in the present embodiment is a so-called "steel wire". The metal wire 14 includes a first metal wire 141, a second metal wire 142, and a third metal wire 143. The first metal wire 141, the second metal wire 142, and the third metal wire 143 are formed integrally with one another.

The first metal wire 141 and the third metal wire 143 of the metal wire 14 fix the shield tube 13 to the plate-like member 11 by pressing the shield tube 13 against the plate-like member 11. The second metal wire 142 is located below the top plate 11A. An end of the first metal wire 141 located far from the second metal wire 142 is bent outwards and inserted in the first fixing member 151 to be fixed to the plate-like member 11. Also, an end of the third metal wire 143 located far from the second metal wire 142 is bent outwards and inserted in the second fixing member 152 to be fixed to the plate-like member 11.

The metal wire 14 is for example set as described below. First, the second metal wire 142 is inserted below the top plate 11A through the opening 113, and the first metal wire 141 and the third metal wire 143 are inserted through the notch 111 and the notch 112, respectively. Next, the end of the first metal wire 141 and the end of the third metal wire 143 are inserted into the first fixing member 151 and the second fixing member 152, respectively, to be fixed to the plate-like member 11.

As illustrated in FIG. 6, for example, a facsimile transceiver 110 is located below the plate-like member 11. The facsimile transceiver 110 includes an integrated circuit (IC) substrate and a plurality of elements such as a capacitor and a resistor, and transmits and receives facsimile via a public telephone line. An upper surface of the facsimile transceiver 110 is covered by the plate-like member 11.

As described above with reference to FIGS. 3 to 6, in the present embodiment, the metal wire 14 fixes the shield tube 13. Therefore, a wiring path of the wiring 12 is fixed. Also, the wiring 12 is covered by the shield tube 13, and the shield tube 13 is connected to the grounding path 20 in a manner that enables electric conduction. Therefore, noise of the wiring 12 is reduced with a simple configuration.

That is, the shield tube 13 is grounded as a result of being connected to the grounding path 20 in a manner that enables electric conduction. Also, the wiring 12 is electrostatically shielded as a result of being covered by the shield tube 13. Therefore, electromagnetic noise emitted from the wiring 12 is reduced by the shield tube 13.

Also, the metal wire 14 fixes the shield tube 13 to the plate-like member 11 by pressing the shield tube 13 against the plate-like member 11, and the plate-like member 11 is connected to the grounding path 20 in a manner that enables electric conduction. Therefore, the grounding path 20 of the shield tube 13 can be formed with a simple configuration.

Further, the image forming apparatus 100 includes the wiring structure 4. Therefore, noise of the wiring 12 can be reduced in the image forming apparatus 100.

Figure 7:
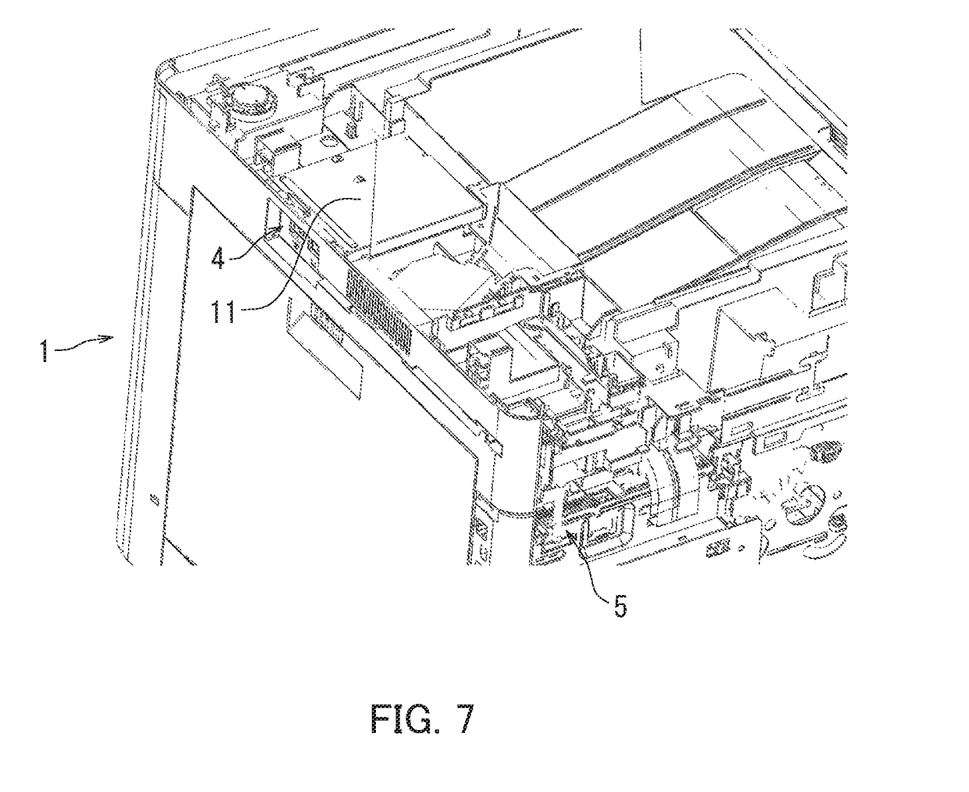
FIG. 7 is a perspective view illustrating another example of the wiring structure according to the embodiment of the present disclosure.

Next, another example of the wiring structure according to the embodiment of the present disclosure will be described with reference to FIGS. 7 and 8. FIG. 7 is a perspective view illustrating a wiring structure 5 as the other example of the wiring structure. FIG. 7 is a perspective view illustrating the image forming unit 1 illustrated in FIG. 3 from a different point of view. In FIG. 7, a side plate is further removed from the image forming unit 1. As illustrated in FIG. 7, the wiring structure 4 is located on the upper surface of the image forming unit 1 and the wiring structure 5 is located on a side surface of the image forming unit 1.

Figure 8:
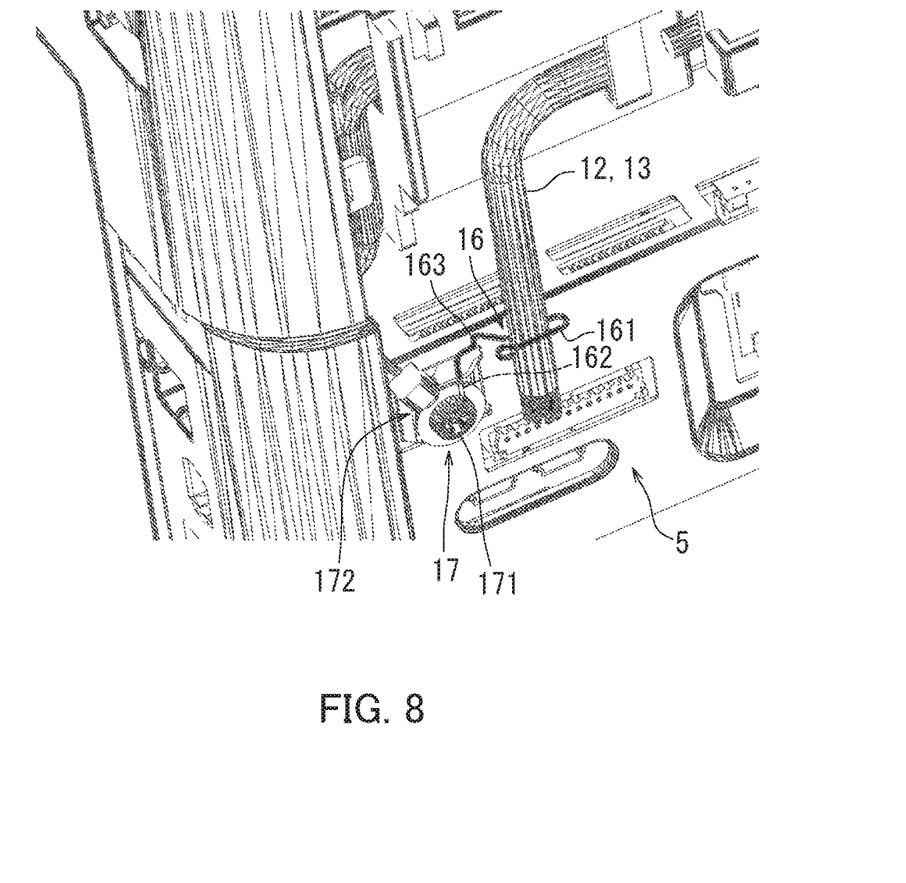
FIG. 8 is an enlarged view of the wiring structure illustrated in FIG. 7.

FIG. 8 is an enlarged view illustrating the wiring structure 5 as the other example of the wiring structure. As illustrated in FIG. 8, the wiring structure 5 includes the wiring 12, the shield tube 13, a metal wire 16, and a fixing member 17. Explanation of the wiring 12 and the shield tube 13, which have been described with reference to FIGS. 3 to 6, will be omitted in order to avoid repetition.

The metal wire 16 fixes the shield tube 13 and constitutes a part of the grounding path 20. The metal wire 16 is a metallic wire having electrical conductivity. The metal wire 16 in the present embodiment is a so-called "steel wire". The metal wire 16 includes one end 161, another end 162, and a junction portion 163.

The one end 161 has a substantial U-shape and supports the shield tube 13 by nipping the shield tube 13. The other end 162 is fixed by the fixing member 17. The junction portion 163 connects the one end 161 with the other end 162.

The fixing member 17 fixes the other end 162. The fixing member 17 includes a bolt 171 and a plate-like member 172. The bolt 171 is screwed in an unillustrated bolt hole in the plate-like member 172. The other end 162 is fixed between a head of the bolt 171 and the plate-like member 172. Further, the plate-like member 172 is connected to the grounding path 20 in a manner that enables electric conduction. The plate-like member 172 corresponds to another example of the "electrically conductive member".

The metal wire 16 is for example set as described below. First, the one end 161 is formed into the substantial U-shape, and the shield tube 13 is nipped by the one end 161. Next, the other end 162 is placed between the head of the bolt 171 and the plate-like member 172 and the bolt 171 is fastened to fix the other end 162 to the plate-like member 172.

As described above with reference to FIGS. 7 and 8, according to the present embodiment, the one end 161 of the metal wire 16 supports the shield tube 13, and the other end 162 of the metal wire 16 is fixed to the plate-like member 172. Further, the plate-like member 172 is connected to the grounding path 20 in a manner that enables electric conduction. Therefore, the grounding path 20 of the shield tube 13 can be formed with a simple configuration. That is, the shield tube 13 can be connected to the grounding path 20 including the metal wire 16 and the plate-like member 172.

Further, the shield tube 13 is grounded as a result of being connected to the grounding path 20 in a manner that enables electric conduction. Also, the wiring 12 is electrostatically shielded as a result of being covered by the shield tube 13. Therefore, electromagnetic noise emitted from the wiring 12 is reduced by the shield tube 13.

Further, the image forming apparatus 100 includes the wiring structure 5. Therefore, noise of the wiring 12 can be reduced in the image forming apparatus 100.

Through the above, the embodiments of the present disclosure have been described with reference to the drawings. However, it should be noted that the present disclosure is not limited to the above embodiments and is practicable in various manners within a scope not departing from the gist of the present disclosure (for example, as described below in sections (1) to (6)). The drawings schematically illustrate elements of configuration in order to facilitate understanding, and properties of elements of configuration illustrated in the drawings, such as thicknesses, lengths, and numbers thereof, may differ from actual properties thereof in order to facilitate preparation of the drawings. Furthermore, properties of the elements of configuration described in the above embodiments, such as shapes and dimensions, are merely examples and are not intended as specific limitations.

(1) As described above with reference to FIGS. 1 to 8, the wiring structure 4 and the wiring structure 5 are located in the image forming apparatus 100. However, the present disclosure is not limited to this configuration. It is only required that the wiring structure 4 and the wiring structure 5 are located in an electronic device. For example, the wiring structure 4 and the wiring structure 5 may be located in a computer, a smartphone, or a digital versatile disc (DVD) player.

(2) As described above with reference to FIGS. 1 to 8, the wiring 12 transmits electric power. However, the present disclosure is not limited to this configuration. It is only required that the wiring 12 transmits either or both of signals and electric power. For example, the wiring 12 may transmit signals. In this configuration, noise entering the wiring 12 from the outside can be reduced by the shield tube 13.

(3) As described above with reference to FIGS. 3 to 6, the plate-like member 11 corresponds to the "electrically conductive member". However, the present disclosure is not limited to this configuration. It is only required that the "electrically conductive member" has electrical conductivity and is connected to the grounding path in a manner that enables electric conduction. For example, the "electrically conductive member" may be a grounded metal frame.

(4) As described above with reference to FIGS. 3 to 6, the metal wire 14 is a "steel wire". However, the present disclosure is not limited to this configuration. It is only required that the metal wire 14 is an electrically conductive wire. For example, the metal wire may be a copper wire. Also, the metal wire may be for example an alloy wire.

(5) As described above with reference to FIGS. 7 and 8, the "electrically conductive member" is the plate-like member 172. However, the present disclosure is not limited to this configuration. It is only required that the "electrically conductive member" has electrical conductivity and is connected to the grounding path in a manner that enables electric conduction. For example, the "electrically conductive member" may be a grounded metal frame.

(6) As described above with reference to FIGS. 7 and 8, the metal wire 16 is a "steel wire". However, the present disclosure is not limited to this configuration. It is only required that the metal wire 16 is an electrically conductive wire. For example, the metal wire may be a copper wire. Also, the metal wire may be for example an alloy wire.

What is claimed is:

1. A wiring structure comprising:
a shield tube configured to cover a wiring;
a metal wire fixing the shield tube and having flexibility; and
a first electrically conductive member, wherein
the shield tube is connected to a grounding path in a manner that enables electric conduction,
the first electrically conductive member is connected to the grounding path in a manner that enables electric conduction,
the first electrically conductive member includes a first plate-like member formed from an electrically conductive material in the shape of a box,
the first plate-like member includes a top plate, a first fixing member, and a second fixing member,
the first fixing member fixes one end of opposite ends of the metal wire to the top plate,
the second fixing member fixes the other end of the opposite ends of the metal wire to the top plate,
the metal wire extends from the first fixing member to cross over a first specific point of the shield tube and then turns back to cross over a second specific point of the shield tube and reach the second fixing member, and
the metal wire fixes the shield tube to the top plate by pressing the first specific point and the second specific point of the shield tube against the top plate.

2. The wiring structure according to claim 1, wherein
the metal wire includes a first metal wire, a second metal wire, and a third metal wire,
the first metal wire, the second metal wire, and the third metal wire are formed integrally with one another,
the first metal wire fixes the shield tube to the top plate by pressing the first specific point of the shield tube against the top plate,
the third metal wire fixes the shield tube to the top plate by pressing the second specific point of the shield tube against the top plate, and
the second metal wire is located below the top plate.

3. The wiring structure according to claim 2, wherein
one end of the first metal wire located far from the second metal wire is fixed by the first fixing member, and
one end of the third metal wire located far from the second metal wire is fixed by the second fixing member.

4. The wiring structure according to claim 2, wherein
the first plate-like member further includes a side plate, a first notch, and a second notch,
the side plate has an opening,
the first notch and the second notch are formed along a side of the top plate of the first plate-like member to be spaced apart from each other,
the first notch and the second notch communicate with each other via the opening,
the first metal wire passes through the first notch,
the third metal wire passes through the second notch, and
the second metal wire is inserted through the opening of the first plate-like member.

5. The wiring structure according to claim 4, wherein
an end of the first metal wire located far from the second metal wire is bent outwards and inserted in the first fixing member to be fixed to the first plate-like member, and
an end of the third metal wire located far from the second metal wire is bent outwards and inserted in the second fixing member to be fixed to the first plate-like member.

6. The wiring structure according to claim 1, further comprising
a second electrically conductive member, wherein
the grounding path includes a specific metal wire,
one end of opposite ends of the specific metal wire supports a third specific point of the shield tube,
the other end of the opposite ends of the specific metal wire is fixed to the second electrically conductive member, and
the second electrically conductive member is connected to the grounding path in a manner that enables electric conduction.

7. The wiring structure according to claim 6, wherein the one end of the specific metal wire has a substantial U-shape and supports the shield tube by clipping the third specific point of the shield tube.

8. The wiring structure according to claim 7, further comprising
a fixing member fixing the other end of the specific metal wire to the second electrically conductive member, wherein
the second electrically conductive member includes a second plate-like member, and
the fixing member fixes the other end of the specific metal wire to the second plate-like member in a manner that enables electric conduction.

9. The wiring structure according to claim 1, wherein the shield tube has a hollow cylindrical shape and is formed to be stretchable by weaving electrically conductive threads.

10. The wiring structure according to claim 9, wherein the threads each include a core formed from an aramid resin and tinned copper foil covering the core.

11. An image forming apparatus comprising:
the wiring structure according to claim 1; and
an image forming device that forms an image on a recording medium.

12. The image forming apparatus according to claim 11, further comprising
a facsimile transceiver, wherein
an upper surface of the facsimile transceiver is covered by the first plate-like member.

* * * * *